Figure 1:
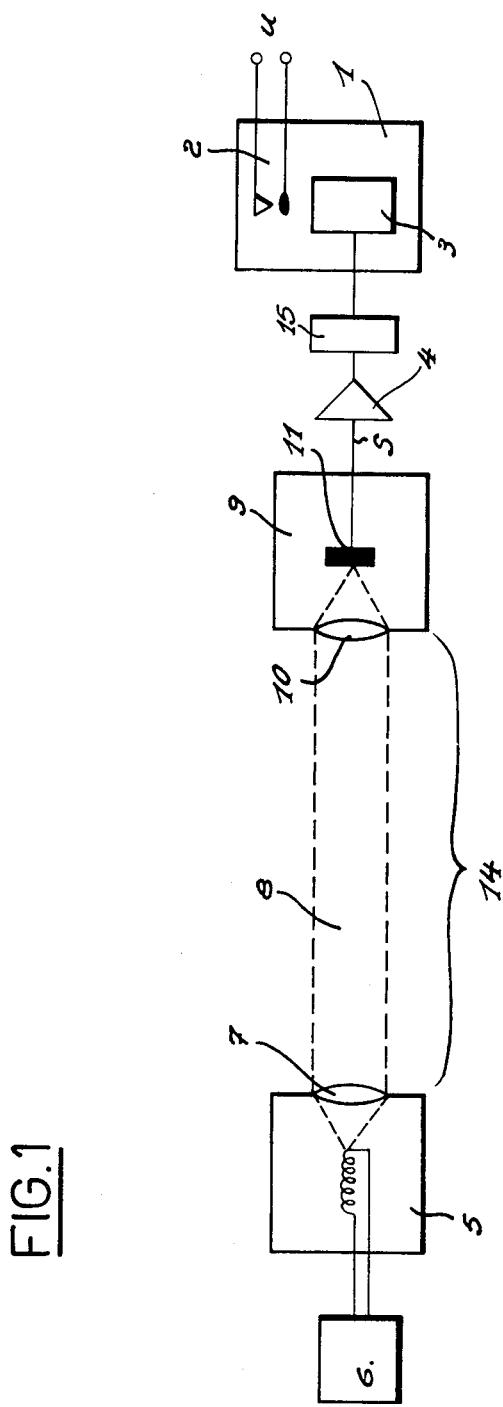

United States Patent [19] [11] 4,070,700
Gabus [45] Jan. 24, 1978

[54] DETECTING ELEMENT FOR A CONTROL DEVICE FOR INVALIDS

[75] Inventor: Jean-Claude Gabus, Cornaux, Switzerland

[73] Assignee: Carba S.A., Liebefeld, Switzerland

[21] Appl. No.: 636,703

[22] Filed: Dec. 1, 1975

[30] Foreign Application Priority Data

Dec. 5, 1974 Switzerland .................. 16136/74

[51] Int. Cl.² .......................................... H01H 47/00
[52] U.S. Cl. ..................................... 361/170; 361/195
[58] Field of Search ..................... 73/432 R; 3/1.1;
128/2 L, 2.05 P, 2 S; 317/12 A, DIG. 2;
340/258 A, 279; 361/170, 195

[56] References Cited

U.S. PATENT DOCUMENTS

| 2,946,931 | 7/1960 | Durbin | 317/124 |
| 3,086,146 | 4/1963 | Edler | 317/124 |
| 3,799,198 | 3/1974 | Kijimoto | 317/124 |
| 3,838,408 | 9/1974 | McMaster | 340/258 A |
| 3,851,301 | 11/1974 | Demers et al. | 340/258 A |

FOREIGN PATENT DOCUMENTS 662,346   4/1964   Italy ................. 317/DIG. 2

Primary Examiner—James J. Gill
Assistant Examiner—Anthony V. Ciarlante
Attorney, Agent, or Firm—Young & Thompson

[57] ABSTRACT

This invention relates to a detecting element for a control device for invalids which detects without any physical contact the presence or the absence or even the displacement of a moving member within a sensitivity range in space, the size of the region in which this movement can be detected being large with regard to said moving member.

1 Claim, 3 Drawing Figures

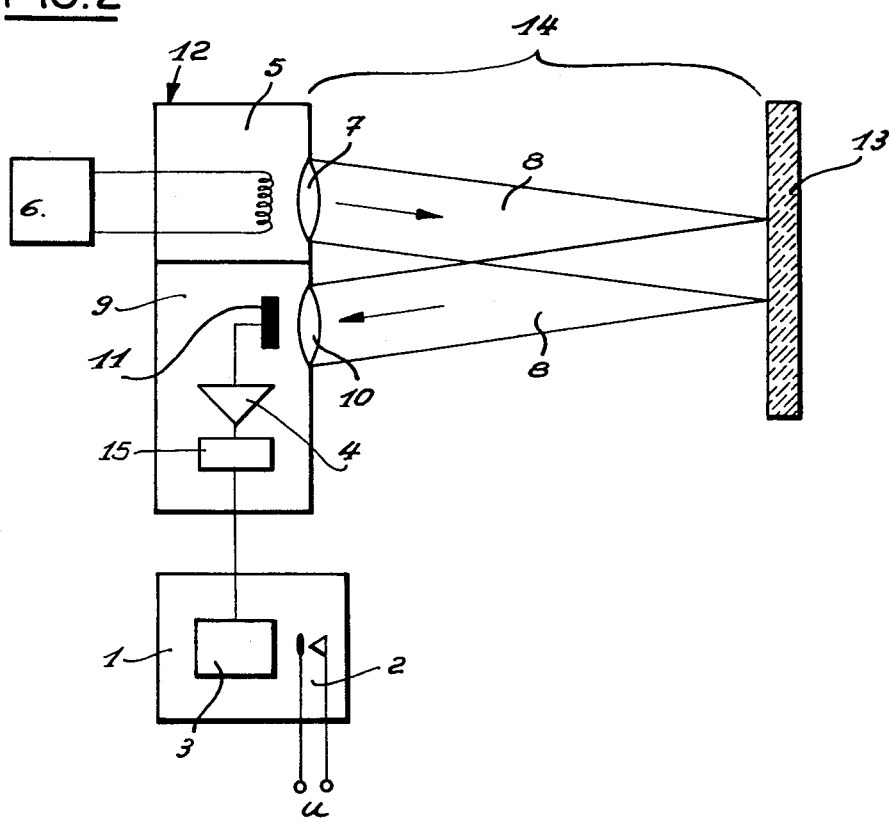
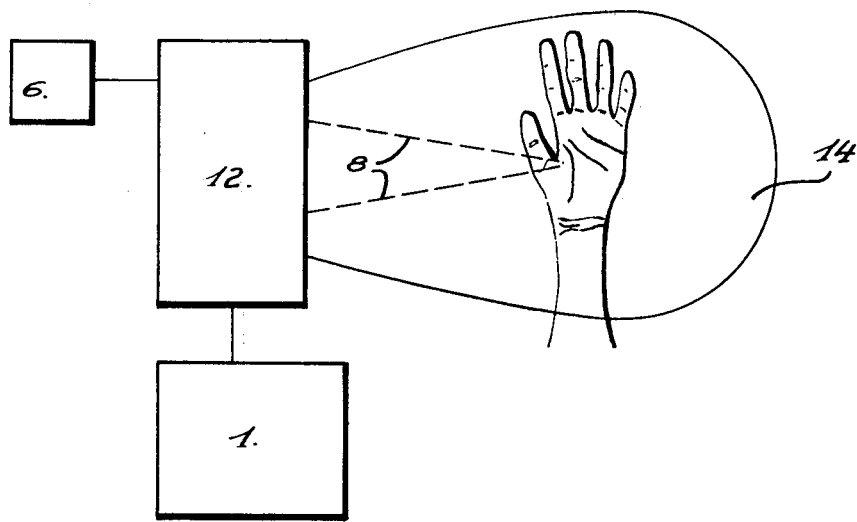

DETECTING ELEMENT FOR A CONTROL DEVICE FOR INVALIDS

Many apparatus are known, which are provided to be used by invalid persons, such as typewriters, devices allowing to automatically turn the pages of a book or even merely allowing to call someone or to open a door. In order to be useful for invalid or infirm persons, these apparatus must be provided with control means which have to be actuatable by said persons in spite of their infirmity.

Some persons and invalids can use as control device relays controlled by mechanical switches; for this purpose, it is necessary that the patient can control the movements of at least one of his members. Two faculties are therefore required, the first being the ability to approach the switch and the second being the ability to actuate it without causing misoperations. For patients who can only carry out very weak movements, the switches have been replaced by microswitches.

In some cases, the patients can only effectively control the movements of their tongue. For them, for example the patient suffering from mutiple sclerosis, there have been developed either microswitches actuatable by the tongue or a moisture detector also actuatable by the tongue.

All these known control devices are suitable for patients who can carry out movements, even of very small amplitudes, allowing them to give orders at a precise location and with a determinate strength.

On the contrary, said known devices are not adapted to be actuated by persons, for example mentally handicaped persons, who cannot co-ordinate their movements with an adequate accuracy, as to either the position or the strength to be applied, in order to actuate with coherence a switch, a micro-switch or even a moisture detector.

The object of the present invention is consequently to realize a detecting element for a control device for invalids, especially for mentally handicapped persons which makes possible the coherent control of any using circuit in spite of the relatively disordered movements of the patient and which cannot be upset or damaged by an accidental movement of the patient. Said detecting element for a control device for invalids is characterized in that it detects, without any physical contact, the presence or the absence, or even the displacement of a moving member, within a sensitivity range in sapce, the size of which is large with regard to said moving member.

The attached drawings illustrate schematically and only by way of example several embodiments of the detecting element according to the present invention.

FIG. 1 shows a first embodiment.
FIG. 2 shows a second embodiment.
FIG. 3 shows a modified embodiment of that shown in FIG. 2.

In the embodiment illustrated in FIG. 1, the control device for invalids comprises a relay 1, the contact 2 of which is inserted in a using circuit or in a control circuit and the coil 3 of which is fed by an amplifier 4 controlled by the detecting element.

The detecting element comprises a luminous or infrared source 5 provided with its feeding device 6. Said luminous or infrared source 5 emits a cylindrical beam 8 by means of a set of lenses shown by numerical reference 7. A receiving device 9, lined up on the source 5, comprises also a set of lenses 10, which focusses the beam 8 on a photo-electric cell 11. The output signal S of said photo-electric cell 11 controls the amplifier 4 and thereby the relay 3.

The distance between the source 5 and the receiving device 9 can range from about 10 cm to 1m, for example. In order to actuate the control device, the invalid has merely to intercept the beam 8 to cause a change in the state of the relay 1 and consequently the control of a using circuit U. It is therefore remarkable that the interception of the beam 8, for example by means of the arm, the leg or the head of the user, does not involve any precision of movement, and that the patient does not come into physical contact with the detecting element.

If the user is trembling or if his uncontrolled movements are of relatively small amplitudes, it is then appropriate to use in the electronic circuit of the control device a time delay element 15, the function of which will be to inhibit the action of a repeated interruption of the beam 8 in a determinate space of time in order to take into account only a voluntary movement of large amplitude, in advancing the member in the range of the beam 8, but to suppress the undesirable action of a series of breaks of the beam 8 owing to unvoluntary and interferencing movements of the member of the patient.

The second embodiment, illustrated in FIG. 2, is based on the same principle and corresponding elements present the same reference numbers. For practical reasons, concerning the required space and the alignment of the source 5 and the receptor 9, these latter have been arranged in a common housing 12 and the beam 8 is reflected by a reflector 13 before it reaches the photoelectric cell 11. The working of this embodiment is identical to that of the first embodiment, the interruption of the beam 8 causing the relay 1 to operate.

In the embodiment shown in FIG. 3, the reflector 13 has been omitted. Thus, in the normally inactivated condition, the ploto-electric cell is not excited. However, as soon as the user places a member, for example the hand, within the sensitivity range 14, determined by the constructive features of the source and the receptor, said member acts as a reflector and the phot-electric cell is excited causing the relay 1 to operate.

Such detecting elements make possible actuating a control device by means of indefinite movements, the sensitivity range 14 being large with regard to the moving member ordering the operation. Furthermore, these detecting elements are insensitive to interfering movements of the ordering member, as far as said movements do not cause said ordering member to go out of the sensitivity range. Still further, the actuating of the control device is obtained without any physical contact between the detecting element and the patient.

Other embodiments may be of course conceived, which are operating exactly as those previously described, for example by replacing the source 5 of light or infrared rays by a source of ultra-sounds and by replacing the photo-electric cell 11 by an ultrasonic detector.

It is to be remarked that by using the ultra-sounds, it is possible, not merely to detect the presence or the absence of a control member in a sensitivity range, but to use the Droppler effect. Indeed, by detecting the difference in frequency between the incident and the reflected beams, it is possible to get a control signal by a movement of the moving member in the sensitivity range and not by the presence of said member in said range.

Furthermore, other invalids or infirm persons can easily order a sound or a noise for example by means of their voice even if they cannot move. In such cases, a microphone is employed allowing to obtain an ordering impulse from a sound or a noise. In some cases, there can be used a laryngophone.

It is to be finally noticed that the sensitivity range can easily be adjusted and regulated, for example by varying the gain of the amplifier 4 in the embodiment shown in FIG. 3, thereby making it very easy to adapt such a detecting element to particular patients. The control device can be consequently also adapted to a particular patient, especially considering the member which is usable for the control, for example the hand, the arm, the leg, the head, etc.

I claim:

1. Detecting element for a control device for invalids who cannot precisely and adequately control their movements, comprising a source of waves adapted to establish a sensitive zone whose size is large relative to the size of a member of the invalid's body that is deliberately movable by the invalid, means for detecting the presence of said member in said zone, and means for transmitting from said detecting means a signal responsive to the presence of said member in said zone and for preventing the transmission of said signal upon interfering movements of said member in said zone, said transmitting and preventing means including a time delay element that prevents the transmission of successive signals upon repeated movements of said member in said zone.

* * * * *